United States Patent [19]
El-Ziq et al.

[11] Patent Number: 5,640,114
[45] Date of Patent: Jun. 17, 1997

[54] VERSATILE SELECT AND HOLD SCAN FLIP-FLOP

[75] Inventors: Yacoub M. El-Ziq, Saratoga; Douglas Kay, Los Gatos, both of Calif.

[73] Assignee: VLSI Technology, Inc., San Jose, Calif.

[21] Appl. No.: 578,101

[22] Filed: Dec. 27, 1995

[51] Int. Cl.⁶ .................................................. H03K 3/289
[52] U.S. Cl. .......................... 327/202; 327/203; 327/211; 327/212
[58] Field of Search ..................... 327/199–203, 327/206, 208–213; 371/22.3

[56] References Cited

U.S. PATENT DOCUMENTS

| | | | |
|---|---|---|---|
| 3,651,492 | 3/1972 | Lockwood | 365/184 |
| 4,435,788 | 3/1984 | Kitagawa et al. | 365/185.21 |
| 4,495,629 | 1/1985 | Zasio et al. | 327/202 |
| 4,972,378 | 11/1990 | Kitagawa et al. | 365/185.11 |
| 5,015,875 | 5/1991 | Giles et al. | 327/203 |
| 5,043,986 | 8/1991 | Agrawal et al. | 371/25.1 |
| 5,130,568 | 7/1992 | Miller et al. | 327/202 |
| 5,175,447 | 12/1992 | Kawasaki et al. | 327/211 |
| 5,257,233 | 10/1993 | Dervisoglu | 365/227 |
| 5,262,988 | 11/1993 | Ochii | 365/188 |
| 5,270,978 | 12/1993 | Matsumoto et al. | 365/203 |
| 5,278,799 | 1/1994 | Uesugi | 365/230.01 |
| 5,282,168 | 1/1994 | Takahashi | 327/51 |
| 5,295,110 | 3/1994 | Sakakibara | 365/222 |
| 5,297,098 | 3/1994 | Nakatani et al. | 365/226 |
| 5,444,404 | 8/1995 | Ebzery | 327/202 |
| 5,463,338 | 10/1995 | Yurash | 327/202 |

*Primary Examiner*—Timothy P. Callahan
*Assistant Examiner*—T. Lam
*Attorney, Agent, or Firm*—Douglas L. Weller

[57] ABSTRACT

A scan flip-flop includes a data input, a scan input, a mode selection input, a mode control input and a clock input. When the mode selection input is set to a first selection value, and the mode control input is set to a first control value, the scan flip-flop operates as a D flip-flop. When the mode selection input is set to a second selection value, the scan flip-flop shifts in a scan input value on the scan input when one of the mode control input and the clock input is toggled. Also, as long as the mode selection input is set to the first selection value, and the mode control input is set to a second control value, the scan flip-flop holds a current value within the scan flip-flop.

16 Claims, 2 Drawing Sheets

VERSATILE SELECT AND HOLD SCAN FLIP-FLOP

BACKGROUND

The present invention concerns the field of flip-flop design and pertains particularly to a flip-flop with a scan output designed for increased versatility.

Testing is an integral part in the designing and manufacturing devices such as integrated circuits. Testing may be performed by placing test vectors within internal registers of device. The resulting values the device places on its outputs are then monitored to verify proper functioning.

Special flip-flops, called scan flip-flops, may be used to form the internal registers used for testing. For example, scan flip-flops can have multiplexed inputs. This allows the scan flip-flops to receive input from one source during normal operation and from another source during testing.

Scan flip-flops may also employ separate scan-outputs which switch in conjunction with the Q outputs. This allows testing to occur with a minimum impact on normal operation of the circuit. See, for example, U.S. Pat. No. 5,043,986 issued to Vishwani D. Agrawal et al for *Method and Integrated Circuit Adapted for Partial-Scan Testability*; U.S. Pat. No. 5,175,447 issued to Soichi Kawasaki et al for *Multifunctional Scan Flip-Flop*; and U.S. Pat. No. 4,495,629 issued to John J. Zasio et al for *CMOS Scannable Latch*.

SUMMARY OF THE INVENTION

In accordance with the preferred embodiment of the present invention, a scan flip-flop is presented. The scan flip-flop includes a data input, a scan input, a mode selection input, a mode control input and a clock input. When the mode selection input is set to a first selection value, and the mode control input is set to a first control value, the scan flip-flop operates as a D flip-flop. When the mode selection input is set to a second selection value, the scan flip-flop shifts in a scan input value on the scan input when one of the mode control input and the clock input is toggled. Also, as long as the mode selection input is set to the first selection value, and the mode control input is set to a second control value, the scan flip-flop holds a current value within the scan flip-flop.

The present invention allows for versatile testing particularly when used with automated test pattern generation (ATPG). The scan flip-flop in accordance with the present invention allows the ATPG to have a set of options to achieve the goal of creating proper input combinations needed to detect a specific fault. In one mode, the scan flip-flop allows data to be held. In another mode data operates as a D flip-flop. In a third mode, data on the scan input is input by toggling either a mode control input or the clock input. This versatility is a significant help for an ATPG process.

DESCRIPTION OF THE PREFERRED EMBODIMENT

Figure 1:
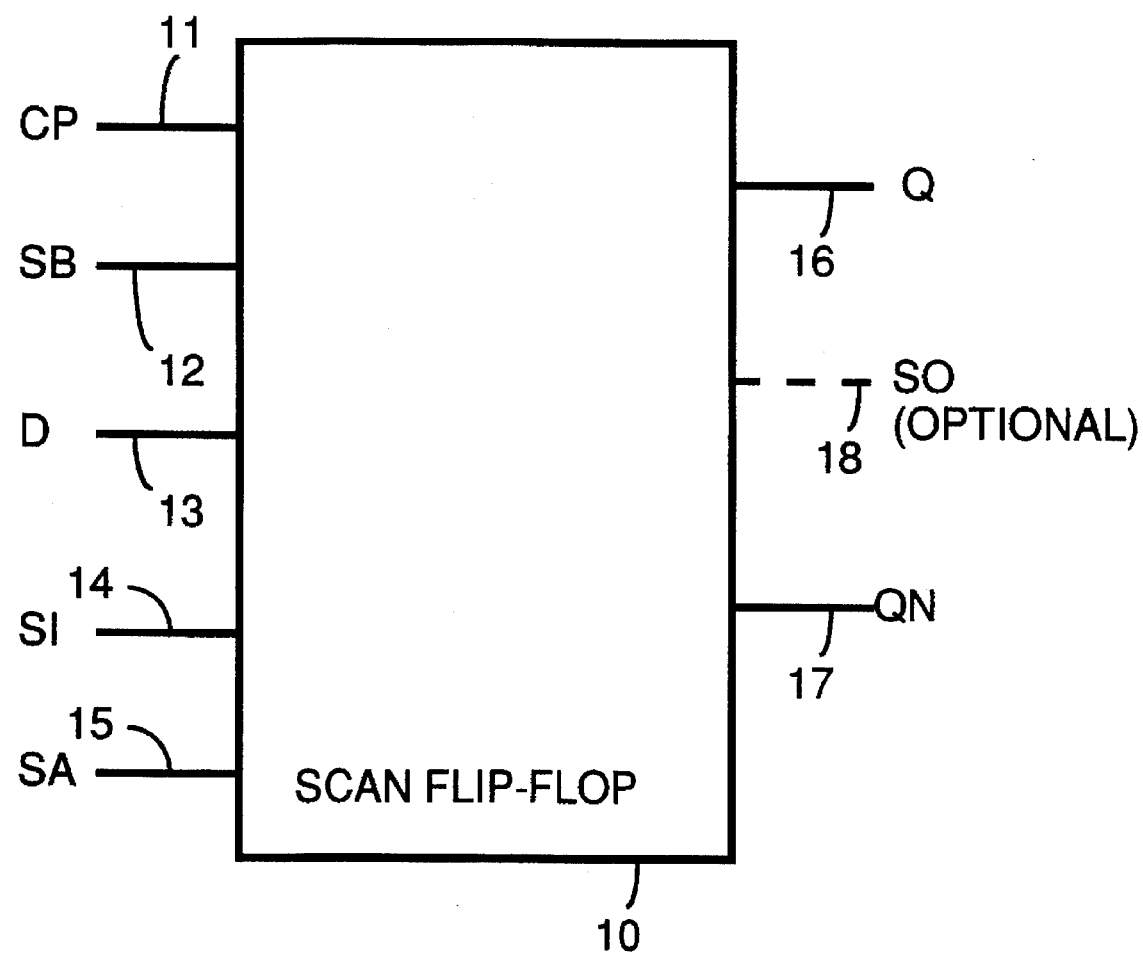
FIG. 1 is a block diagram showing inputs and outputs to a scan flip-flop in accordance with a preferred embodiment of the present invention.

FIG. 1 is a block diagram showing inputs and outputs to a scan flip-flop 10 in accordance with a preferred embodiment of the present invention. Scan flip-flop 10 has a clock (CP) input 11, a data (D) input 13, a scan data (SI) input 14, a mode selection (SA) input 15 and a mode control (SB) input 12. Scan flip-flop 10 has a data (Q) output 16 and an inverted data (QN) output 17. Optionally, scan flip-flop 10 may also include a scan (SO) output 18 which has the save value as data (Q) output 16.

When mode selection (SA) input 15 and mode control (SB) input 12 are both set to logic 0, scan flip-flop 10 acts as a positive edge triggered D flip/flop. Data (D) input 13 provides data input to scan flip-flop 10. This is referred to as functional (normal operating) mode. In functional mode, clock (CP) input 11 is toggled to shift the data placed on data (D) input 13 to data (Q) output 16 and to invert and shift the data placed on data (D) input 13 to inverted data (QN) output 17.

When mode selection (SA) input 15 is set to logic 1, scan flip-flop 10 enters a scan shift mode. In scan shift mode, scan data (SI) input 14 provides data input to scan flip-flop 10. Either mode control (SB) input 12 or clock (CP) input 11 is toggled to shift the data on scan data (SI) input 14 to data (Q) output 16 and inverted data (QN) output 17. When one of mode control (SB) input 12 or Clock (CP) input 11 is toggled to shift the data, the other of mode control (SB) input 12 or Clock (CP) input 11 is held to logic 0.

When mode selection (SA) input 15 is set to logic 0 and mode control (SB) input 12 is set to logic 1, scan flip-flop 10 enters a scan hold mode. In scan hold mode, scan flip-flop 10 holds data without performing any shifting, even when clock (CP) input 11 is toggled.

Table 1 below summarizes the operation of scan flip-flop 10, as described above.

TABLE 1

| CP | SA | SB | Mode of Operation |
|----|----|----|-------------------|
| T  | 0  | 0  | Functional Mode |
| 0  | 1  | T  | Scan Shift Mode (Toggle SB) |
| T  | 1  | 0  | Scan Shift Mode (Toggle CP) |
| X  | 0  | 1  | Hold Mode |

In Table 1, "X" represents a "don't care" state. "T" indicates a positive edge trigger toggle to obtain the listed values for "Q" and "QN".

Figure 2:
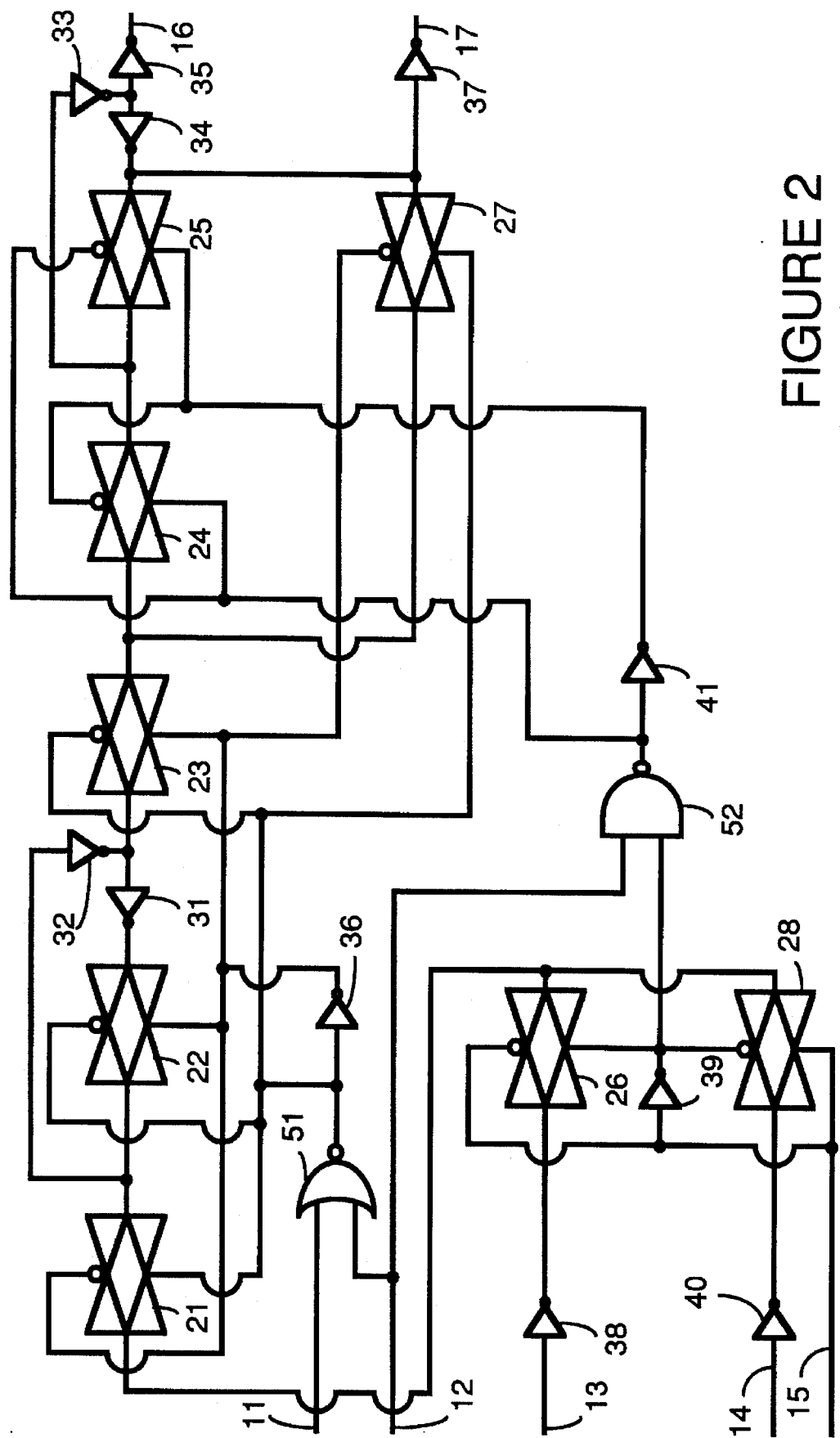
FIG. 2 is a schematic showing a scan flip-flop in accordance with the preferred embodiment of the present invention.

FIG. 2 is a schematic showing implementation of scan flip-flop 10 in accordance with the preferred embodiment of the present invention. FIG. 2 shows scan flip-flop 10 to include a CMOS transmission gate 21, a CMOS transmission gate 22, a CMOS transmission gate 23, a CMOS transmission gate 24, a CMOS transmission gate 25, a CMOS transmission gate 26, a CMOS transmission gate 27, a CMOS transmission gate 28, an inverter 31, an inverter 32, an inverter 33, an inverter 34, an inverter 35, an inverter 36, an inverter 37, an inverter 38, an inverter 39, an inverter 40, an inverter 41, a logic NOR gate 51 and a logic NAND gate 52, connected as shown.

Table 2 below summarizes the operation of scan flip-flop 10, as implemented in FIG. 2.

TABLE 2

| D | SI | SA | SB | CP | Q | QN | MODE |
|---|----|----|----|----|---|----|------|
| 0 | X  | 0  | 0  | T  | 0 | 1  | normal |
| 1 | X  | 0  | 0  | T  | 1 | 0  | normal |
| X | X  | 0  | 1  | T  | q | qn | hold |

TABLE 2-continued

| D | SI | SA | SB | CP | Q | QN | MODE |
|---|----|----|----|----|---|----|------|
| X | 0 | 1 | T | 0 | 0 | 1 | scan |
| X | 1 | 1 | T | 0 | 1 | 0 | scan |
| X | 0 | 1 | 0 | T | 0 | 1 | scan |
| X | 1 | 1 | 0 | T | 1 | 0 | scan |
| X | X | X | 0/1 | 0/1 | q | qn | either |

In Table 2, "X" represents a "don't care" state. "T" indicates a positive edge trigger to obtain the listed values for "Q" and "QN". The entry "q" indicates the value for "Q" is unchanged from the previous value. The entry "qn" indicates the value for "QN" is unchanged from the previous value. The last row of Table 2 indicates that scan flip-flop 10 will continue to hold value the data as long as both mode control (SB) input 12 and dock (CP) input 11 stay in either of logic 1 or logic 0 without toggle.

Scan flip-flop 10, described above, is a significant improvement for use with automated test pattern generation (ATPG). ATPG typically starts by selecting a fault from a fault list that was generated using a specific (e.g. stuck at) model. The ATPG process consists of three major tasks. The first task is fault insertion. The second task is forward propagation. The third task is backward justification.

Backward justification is the most difficult and time consuming of the three tasks. During this process, a storage element may need to be either held at its current value or may need to be set to a new value. Scan flip-flop 10 allows the ATPG to have a set of options to achieve the goal of creating proper input combinations needed to detect a specific fault. Scan flip-flop 10 facilitates performance of the ATPG tasks. For example, as described above, scan flip-flop 10 allows data to be held by setting mode selection (SA) input 15 to logic 0 and setting mode control (SB) input 12 to logic 1. Data may be propagated through scan flip-flop 10 by setting mode selection (SA) input 15 to logic 0 and setting mode control (SB) input 12 to logic 0. Particular values are loaded into scan flip-flop 10 by placing the value on scan data (SI) input 14, setting mode selection (SA) input 15 to logic 1 and toggling either mode control (SB) input 12 or dock (CP) input 11.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A scan flip-flop comprising:
   a data input for receiving input when the scan flip-flop is in a normal operating mode;
   a scan input for receiving input when the scan flip-flop is in a scan shift mode;
   a mode selection input;
   a mode control input; and
   a clock input;
   wherein
   when the mode selection input is set to a first selection value, and the mode control input is set to a first control value, the scan flip-flop operates in the normal operating mode as a D flip-flop, shifting in a data value on the data input when the clock input is toggled,
   when the mode selection input is set to a second selection value, the scan flip-flop operates in the scan shift mode shifting in a scan input value on the scan input when one of the mode control input and the clock input is toggled, and
   as long as the mode selection input is set to the first selection value, and the mode control input is set to a second control value, the scan flip-flop holds a current value within the scan flip-flop, despite the clock input being toggled.

2. A scan flip-flop as in claim 1 additionally comprising:
   a data output; and
   an inverted data output.

3. A scan flip-flop as in claim 1 wherein the first selection value is logic 0, the second selection value is logic 1, the first control value is logic 0 and the second control value is logic 1.

4. A scan flip-flop as in claim 1 wherein when the mode selection input is set to the first selection value, and the mode control input is set to the first control value, data is shifted into the scan flip-flop upon a transition from logic 0 to logic 1 on the clock input.

5. A scan flip-flop as in claim 1 wherein when the mode selection input is set to the second selection value, the scan input value on the scan input is shifted into the scan flip-flop upon a transition from logic 0 to logic 1 on one of the mode control input or the clock input.

6. A scan flip-flop comprising:
   a data input for receiving input when the scan flip-flop is in a normal operating mode;
   a scan input;
   a mode selection input;
   a mode control input; and
   a clock input;
   first gate means for operating the scan flip-flop as a D flip-flop in the normal operating mode so that a data value on the data input is shifted into the D flip-flop when the clock input is toggled when the mode selection input is set to a first selection value and the mode control input is set to a first control value;
   second gate means for shifting into the scan flip-flop a scan input value on the scan input upon one of the mode control input and the clock input being toggled when the mode selection input is set to a second selection value; and,
   third gate means for holding a current value within the scan flip-flop as long as the mode selection input is set to the first selection value, and the mode control input is set to a second control value, despite the clock input being toggled.

7. A scan flip-flop as in claim 6 additionally comprising:
   a data output; and
   an inverted data output.

8. A scan flip-flop as in claim 6 wherein the first selection value is logic 0, the second selection value is logic 1, the first control value is logic 0 and the second control value is logic 1.

9. A scan flip-flop as in claim 6 wherein when the mode selection input is set to the first selection value, and the mode control input is set to the first control value, data is shifted into the scan flip-flop upon a transition from logic 0 to logic 1 on the clock input.

10. A scan flip-flop as in claim 6 wherein when the mode selection input is set to the second selection value, the scan input value on the scan input is shifted into the scan flip-flop upon a transition from logic 0 to logic 1 on one of the mode control input and the clock input.

11. A method implemented by a scan flip-flop comprising the steps of:
   (a) when a mode selection input is set to a first selection value, and a mode control input is set to a first control value, operating the scan flip-flop as a D flip-flop, receiving a data input value on a data input when a clock input toggled;
   (b) when the mode selection input is set to a second selection value, shifting into the scan flip-flop a scan input value on a scan input when one of the mode control input and the clock input is toggled; and,
   (c) while the mode selection input is set to the first selection value, and the mode control input is set to a second control value, holding a current value within the scan flip-flop, despite the clock input being toggled.

12. A method as in claim 11 wherein in step (a) the scan flip-flop outputs data on a data output.

13. A method as in claim 12 wherein in step (a) the scan flip-flop outputs inverted data on an inverted data output.

14. A method as in claim 12 wherein the first selection value is logic 0, the second selection value is logic 1, the first control value is logic 0 and the second control value is logic 1.

15. A method as in claim 11 wherein in step (a), data is shifted into the scan flip-flop upon a transition from logic 0 to logic 1 on the clock input.

16. A method as in claim 11 wherein in step (b), the scan input value on the scan input is shifted into the scan flip-flop upon a transition from logic 0 to logic 1 on one of the mode control input and the clock input.

* * * * *